(12) United States Patent
Markanday et al.

(10) Patent No.: US 11,444,236 B2
(45) Date of Patent: Sep. 13, 2022

(54) FLEXIBLE POLYOXYMETHYLENE-BASED PIEZOELECTRIC COMPOSITES

(71) Applicant: SABIC Global Technologies B.V., Bergen op Zoom (NL)

(72) Inventors: Meghna Markanday, Bangalore (IN); Pradeep Singh, Bangalore (IN); Arun Kumar Sikder, Bangalore (IN); Theo Hoeks, Bergen op Zoom (NL); Venkata Ramanarayanan Ganapathy Bhotla, Bangalore (IN); Anantharaman Dhanabalan, Bangalore (IN)

(73) Assignee: SABIC GLOBAL TECHNOLOGIES B.V., Bergen op Zoom (NL)

( * ) Notice: Subject to any disclaimer, the term of this patent is extended or adjusted under 35 U.S.C. 154(b) by 351 days.

(21) Appl. No.: 16/749,359

(22) Filed: Jan. 22, 2020

(65) Prior Publication Data

US 2020/0235281 A1 Jul. 23, 2020

Related U.S. Application Data

(60) Provisional application No. 62/795,114, filed on Jan. 22, 2019.

(51) Int. Cl.
*H01L 41/18* (2006.01)
*H01L 41/37* (2013.01)
(Continued)

(52) U.S. Cl.
CPC ............ *H01L 41/183* (2013.01); *G01L 1/16* (2013.01); *H01L 41/09* (2013.01);
(Continued)

(58) Field of Classification Search
CPC ... G01L 1/18; G01L 1/20; G01L 1/205; G01L 1/2287; G01L 1/16; G01L 1/24; H01L 21/3212; H01L 29/0673; H01L 51/0084; H01L 24/05; H01L 2924/00011; H01L 51/5281; H01L 2224/12105; H01L 29/0676; H01L 51/0051; H01L 51/5259;
(Continued)

(56) References Cited

U.S. PATENT DOCUMENTS 4,128,489 A 12/1978 Seo
4,191,193 A 3/1980 Seo
(Continued)

FOREIGN PATENT DOCUMENTS

CN 113490709 A * 10/2021 ........... C04B 35/491
EP 0623935 11/1994
(Continued)

*Primary Examiner* — Andre J Allen
(74) *Attorney, Agent, or Firm* — Norton Rose Fulbright US LLP

(57) ABSTRACT

A polymer composite thin film exhibiting piezoelectric properties may include a polymer matrix with base material of Polyoxymethylene (POM) and a piezoelectric additive of greater than approximately five (5) percent by weight of the polymer composite thin film. The piezoelectric additives may include $BaTiO_3$ and KNN. The polymer composite thin film exhibits piezoelectric characteristics and may be used in electronic devices in piezoelectric actuators and piezoelectric sensors.

20 Claims, 7 Drawing Sheets

(51) Int. Cl.
*H01L 41/113* (2006.01)
*H01L 41/09* (2006.01)
*G01L 1/16* (2006.01)
*G06F 3/01* (2006.01)

(52) U.S. Cl.
CPC .......... H01L 41/1132 (2013.01); H01L 41/37 (2013.01); *G06F 3/016* (2013.01)

(58) Field of Classification Search
CPC ... H01L 21/561; H01L 51/0042; H01L 35/32; H01L 51/0046; H01L 33/20; H01L 41/18; H01L 51/0013; H01L 51/5024; H01L 51/0021; H01L 31/0352; H01L 33/08; H01L 31/02322; H01L 21/486; H01L 2924/07802; H01L 31/1884; H01L 51/0002; H01L 51/0047; H01L 23/3128; H01L 31/042; H01L 2225/06517; H01L 23/49894; H01L 2924/1461; H01L 23/367; H01L 23/49811; H01L 41/29; H01L 2224/05599; H01L 2224/13147; H01L 2224/29101; H01L 2224/8385; H01L 24/92; H01L 2924/01049; H01L 23/3121; H01L 23/433; H01L 2924/30105; H01L 21/31144; H01L 2224/29111; H01L 2224/29324; H01L 2224/73267; H01L 23/49838; H01L 24/45; H01L 51/008; H01L 31/035218; H01L 27/156; H01L 51/007; H01L 51/424; H01L 27/32; H01L 51/0009; H01L 51/426; H01L 2221/68327; H01L 21/02603; H01L 23/13; H01L 24/17; H01L 27/3211; H01L 21/78; H01L 51/0089; H01L 51/05; H01L 2924/0781; H01L 2924/00013; H01L 2933/0091; H01L 51/0508; H01L 24/11; H01L 27/088; H01L 51/4213; H01L 23/3135; H01L 23/3731; H01L 2924/351; H01L 2224/73203; H01L 51/0054; H01L 51/0566; H01L 21/6836; H01L 33/04; H01L 51/448; H01L 51/5092; H01L 23/3675; H01L 21/31695; H01L 2224/45099; H01L 25/0655; H01L 2924/01028; H01L 2933/0083; H01L 21/4857; H01L 51/0045; H01L 51/5096; H01L 2251/5361; H01L 2251/558; H01L 2924/1305; H01L 2224/94; H01L 23/4275; H01L 24/03; H01L 2224/97; H01L 27/3246; H01L 2933/0033; H01L 2224/29355; H01L 2225/06513; H01L 2933/0058; H01L 51/5284; H01L 21/0274; H01L 23/48; H01L 33/38; H01L 21/0337; H01L 35/24; H01L 2924/01051; H01L 51/0049; H01L 51/447; H01L 23/481; H01L 31/0322; H01L 21/02216; H01L 2924/01042; H01L 41/0478; H01L 51/0073; H01L 33/508; H01L 33/641; H01L 21/7682; H01L 2224/76155; H01L 51/524; H01L 25/0652; H01L 2224/45144; H01L 2924/01077; H01L 31/06; H01L 23/145; H01L 23/49883; H01L 2924/01039; H01L 2924/07811; H01L 2924/10329; H01L 41/082; H01L 51/0091; H01L 51/5032; H01L 25/16; H01L 33/18; H01L 2924/01025; H01L 2924/0104; H01L 31/02168; H01L 51/5296; H01L 2224/18; H01L 2224/83851; H01L 2251/301; H01L 2924/01327; H01L 31/02167; H01L 33/46; H01L 51/0096; H01L 51/4246; H01L 21/31053; H01L 2224/05573; H01L 2224/05644; H01L 2224/29387; H01L 2224/82102; H01L 29/42324; H01L 33/26; H01L 2924/01058; H01L 31/0512; H01L 21/02532; H01L 2221/68381; H01L 2225/06541; H01L 23/4985; H01L 51/102; H01L 2224/29344; H01L 2224/83101; H01L 23/5329; H01L 2924/3512; H01L 51/003; H01L 21/4846; H01L 2224/13111; H01L 2924/18162; H01L 21/32125; H01L 2924/01014; H01L 2224/81815; H01L 2924/13055; H01L 51/0023; H01L 51/0092; H01L 2224/05647; H01L 41/0805; H01L 51/0079; H01L 21/02381; H01L 2224/92125; H01L 2251/306; H01L 2224/29099; H01L 27/14687; H01L 31/072; H01L 41/1876; H01L 51/422; H01L 51/5271

See application file for complete search history.

(56) References Cited

U.S. PATENT DOCUMENTS

| | | | |
|---|---|---|---|
| 5,702,629 | A | 12/1997 | Cui et al. |
| 8,465,810 | B2 | 6/2013 | Umino |
| 9,484,524 | B2 | 11/2016 | Yu et al. |
| 2011/0074249 | A1* | 3/2011 | Sakashita ................. C08K 3/22 |
| | | | 252/62.9 R |
| 2020/0303621 | A1* | 9/2020 | Guhathakurta ......... H01L 41/37 |
| 2021/0028347 | A1* | 1/2021 | Khaliq ................. H01L 41/183 |

FOREIGN PATENT DOCUMENTS

| | | | | |
|---|---|---|---|---|
| JP | 56052464 | | 12/1981 | |
| JP | 61023677 | | 6/1986 | |
| JP | 3908624 | B2 * | 4/2007 | ............. H04M 1/03 |
| JP | 3947543 | B2 * | 7/2007 | |
| WO | WO-2021228898 | A1 * | 11/2021 | |

* cited by examiner

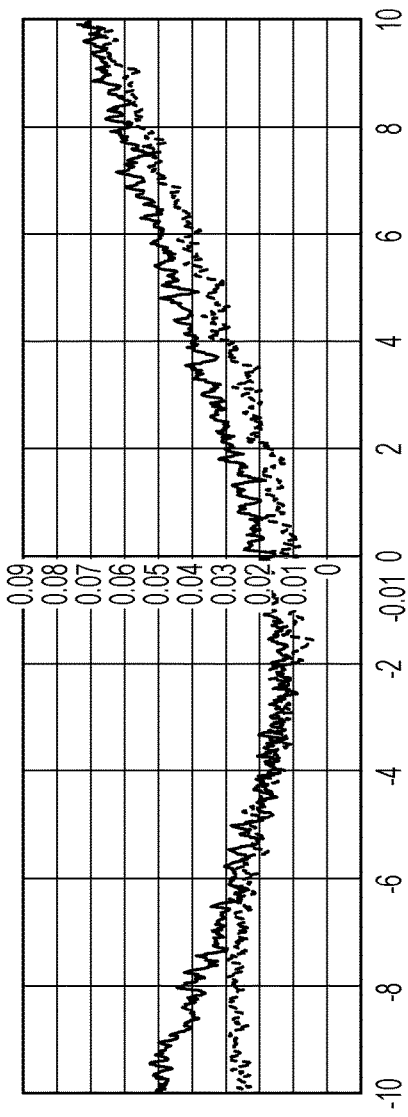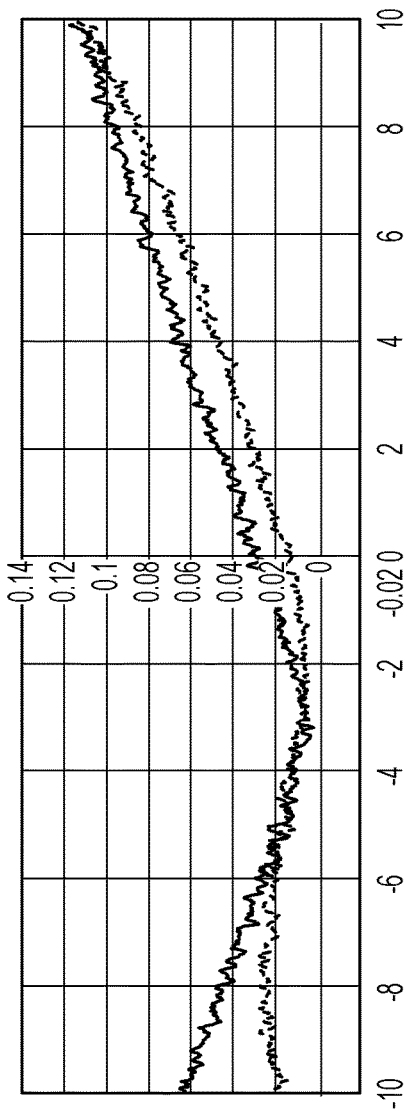

FLEXIBLE POLYOXYMETHYLENE-BASED PIEZOELECTRIC COMPOSITES

CROSS-REFERENCE TO RELATED APPLICATIONS

This application claims the benefit of priority of U.S. Provisional Patent Application No. 62/795,144 filed Jan. 22, 2019, which is hereby incorporated by reference in its entirety.

FIELD OF THE DISCLOSURE

The instant disclosure relates to materials. More specifically, this disclosure relates to piezoelectric materials, and their uses in electronic devices as input devices.

BACKGROUND

Interaction with electronic devices, such as computers, home appliances, or car consoles, has been characterized by the use of mechanical switches (keyboard, buttons, knobs, etc.) as the input mechanism for the given system to perform an action. An on/off switch in many appliances is a mechanical switch that lets current flow through it when pressed but presents a large resistance to current flow when not pressed. Switches are used in computer keyboards which users apply force to enter the desired letter. Some recent developments incorporate the use of touch sensitive technology to replace the mechanical switches. Capacitive, resistive, or optical-based proximity or touch sensors are being used to replace mechanical switches and knobs, such as found in a car's console. Touch-sensitive displays are embedded into systems like mobile phones, tablets, or even ATM machines. However, the conventional touch-sensitive technologies have a major drawback in that there is a lack of sense of touch for the user. That is, a user cannot feel operation of the device like a mechanical switch.

Piezoelectric materials are one of the recent materials being used in various applications in the area of sensors and actuators. Conventional piezoelectric materials include ferroelectric ceramics, such as Barium Titanate (BT) and Lead Zirconium Titanate (PZT). Other conventional piezoelectric materials include polymers, such as polyvinylidene fluoride (PVDF) and its copolymers. Although these conventional materials have been used in a wide range of piezoelectric applications, these materials have undesirable trade-offs. Thus, a combination of conventional materials can be required to obtain desired properties. The trade-off is between a desire for high piezoelectric activity, low density, and mechanical flexibility. High piezoelectric activity is desirable to increase the sensitivity of sensors that use a piezoelectric material, and thus improve a user's experience. Mechanical flexibility is desirable to allow construction of thin and/or wearable devices. However, with conventional materials obtaining mechanical flexibility requires trading-off piezoelectric activity.

SUMMARY

Embodiments of the disclosure provide a polyoxymethylene (POM)-based composite polymer thin film with enhanced piezoelectric performance even with a very low loading of piezoelectric additives. The composite thin film can be used in piezoelectric-based sensors. The POM-based composite can be mechanically flexible to allow for assembly of mechanically-flexible sensor modules and electronic devices. The polymer composite thin film exhibiting piezoelectric properties may include a polymer matrix, in which the polymer matrix comprises polyoxymethylene (POM); and a piezoelectric additive comprising greater than approximately five (5) percent by weight of the polymer composite thin film, between five (5) and thirty percent by weight of the polymer composite thin film, or greater than thirty (30) percent by weight of the polymer composite thin film. Below five (5) percent by weight, the value of d33 for the composite thin film is not significant enough to be of commercial value as a piezoelectric material. In some embodiments, the polymer composite thin film comprises inorganic Perovskites, processing aids, dispersing aids and heat stabilizers, antioxidants, flow modifiers and plasticizers. In some embodiments, the polymer composite thin film has a thickness of between 30 and 120 micrometers. Composites with low loading (e.g., 1-20%) of inorganic ferroelectric ceramics (e.g., $BaTiO_3$ BT, PZT, etc.) provide a molecular structure of POM in synergy with low loading of piezoelectric ceramics to provide a good combination of piezoelectric performance with mechanical flexibility that opens the scope for broadening applications of conventional piezoelectric composites.

The piezoelectric additive may be an inorganic material, such as one or more of Lithium-doped Potassium Sodium Niobate Rubidium-doped Potassium Sodium Niobate, Caesium-doped Potassium Sodium Niobate, and undoped Potassium Sodium Niobate (KNN). In some embodiments, the piezoelectric additive comprises an inorganic additive comprising of doped Potassium Sodium Niobate (KNN) or undoped Potassium Sodium Niobate (KNN) in combination with at least one of PZT-Lead Zirconium Titanate, BT-Barium Titanate, and Zinc Oxide. In some embodiments, the piezoelectric additive comprises Potassium Sodium Niobate (KNN), and wherein the piezoelectric additive comprises between thirty-five (35) and ninety-eight (98) percent by weight of the polymer composite film. In some embodiments, the piezoelectric additive comprises Potassium Sodium Niobate (KNN) in combination with Lithium, and wherein the piezoelectric additive comprises between thirty-five (35) and ninety-eight (98) percent by weight of the polymer composite film. In some embodiments, the piezoelectric additive comprises at least one of a zero-dimensional, and one-dimensional structural pattern and a two-dimensional structural pattern. Example zero-dimensional structures include quantum dots, arrays of nanoparticles, core-shell nanoparticles, hollow cubes and nanospheres, one-dimensional. Examples of two-dimensional structures include nanowires, nanorods, nanotubes, nanobelts, nanoribbons and nanoplates, nanosheets, nanowalls, and nanodisks. Example three-dimensional structures include nanoballs, nanocoils, nanocones, and nanopillars. Varying dimensional structures exhibit different properties based on surface area, interaction with materials, dispersion within the matrix, and inter-particle interaction.

Such materials, of which some embodiments are listed above, provide improvements in user interaction with electronic devices for receiving user input and user feedback. As non-limiting examples, the materials may be used in electronic devices such as light switches or consumer smartphones to interact with users. Additional uses for such materials include bio-diagnostics, nano- and micro-electromechanical systems, imaging, sensors, actuators, and electronics. When POM-based polymer composite thin films are used in piezoelectric-based sensors, the sensors may generate an analog signal proportional to an amount of deflection applied to the piezoelectric sensor by a user. In any electronic device, the thin film materials may be patterned through microfabrication techniques including electron beam lithography, ion milling, soft lithography, self-assembly, electrospinning, and contact printing.

The POM-based composite polymer thin film can be manufactured by physical mixing of polyoxymethylene (POM) powder with the piezoelectric additive in proportions w/w percentage of the piezoelectric additive to the polyoxymethylene (POM). The manufacturing may also include melt-blending in an extruder the polyoxymethylene (POM) powder with the piezoelectric additive to form pellets of a polymer composite and/or compression molding by hot-pressing the pellets to form the polymer composite thin film at a temperature exceeding 150 degrees Celsius. The manufacturing may also include physical mixing followed by a heat sintering step to form a pellet or thin film for further processing.

The piezoelectric-based sensor or apparatus may execute steps to facilitate the processing and transmission of user input received at the triboelectric-based sensor. A processor, or other logic circuitry, may be configured through hardware, software, and/or firmware to execute steps including receiving, at a triboelectric-based sensor of a touch device, an applied force; converting, at the triboelectric-based sensor of the touch device, the applied force to an electric signal; transmitting, by the triboelectric-based sensor of the touch device, the electric signal to logic circuitry, such as an application processor; generating by the logic circuitry, a haptic feedback signal in response to and/or based on the electric signal; and/or outputting the haptic feedback signal to a haptic feedback device.

The foregoing has outlined rather broadly certain features and technical advantages of embodiments of the present invention in order that the detailed description that follows may be better understood. Additional features and advantages will be described hereinafter that form the subject of the claims of the invention. It should be appreciated by those having ordinary skill in the art that the conception and specific embodiment disclosed may be readily utilized as a basis for modifying or designing other structures for carrying out the same or similar purposes. It should also be realized by those having ordinary skill in the art that such equivalent constructions do not depart from the spirit and scope of the invention as set forth in the appended claims. Additional features will be better understood from the following description when considered in connection with the accompanying figures. It is to be expressly understood, however, that each of the figures is provided for the purpose of illustration and description only and is not intended to limit the present invention.

BRIEF DESCRIPTION OF THE DRAWINGS

For a more complete understanding of the disclosed system and methods, reference is now made to the following descriptions taken in conjunction with the accompanying drawings.

FIG. 7 is a graph illustrating a piezoelectric force microscopy (PFM) measurement on polyoxymethylene (POM) material showing a d33 value of 4 pm/V.

FIG. 8 is a graph illustrating a piezoelectric force microscopy (PFM) measurement on a polyoxymethylene (POM) material with piezoelectric additive of 1% BaTiO3 showing a d33 value of 6 pm/V according to embodiments of the disclosure.

DETAILED DESCRIPTION

Polyoxymethylene (POM, also known as polyacetal)-based piezoelectric materials can be used to form a piezoelectric thin film layer for use as a touch-sensitive component of sensors and actuators. The mechanically-flexible nature of some of the POM-based materials can enable applications for piezoelectric-based sensors in wearables. The piezoelectric behavior of polyoxymethylene (POM, Polyacetal) can be enhanced by the addition of piezoelectric additives (e.g., Barium Titanate (BaTiO3), Lead Zirconium Titanate (PZT), Zinc Oxide (ZnO) etc.) in weight percentages as low as 5 w/w %, between 5-30 w/w %, and greater than 30 w/w %. Piezoelectric behavior in systems using such thin film materials is observed without any additional processes of poling.

Figure 1:
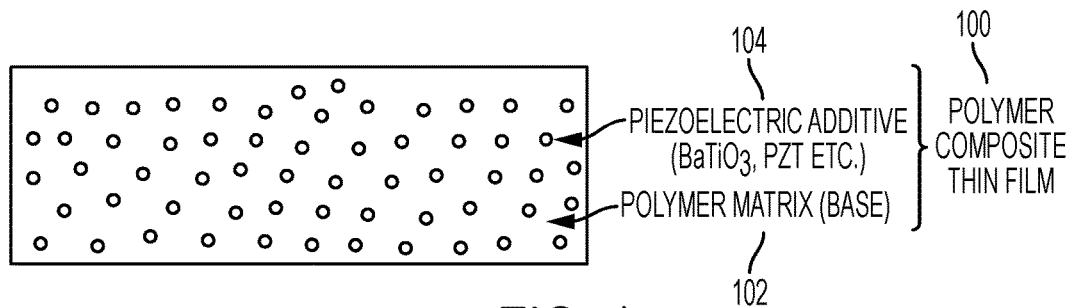
FIG. 1 is a block diagram illustrating a piezoelectric composite according to embodiments of the disclosure.

FIG. 1 is a block diagram illustrating a piezoelectric composite according to embodiments of the disclosure. A polymer composite thin film 100 may include a base material 102 comprising a polymer matrix, in which the polymer matrix comprises polyoxymethylene (POM). The base material 102 may include inorganic Perovskites, processing aids, dispersing aids and heat stabilizers, antioxidants, flow modifiers and/or plasticizers.

The thin film 100 may include a piezoelectric additive 104 integrated with the polymer base material 102. The piezoelectric additive may be greater than approximately five (5)

percent by weight of the polymer composite thin film and may be any inorganic piezoelectric additives. In some embodiments, the piezoelectric additive may be an inorganic additive consisting at least one of Lithium-doped Potassium Sodium Niobate Rubidium-doped Potassium Sodium Niobate, Caesium-doped Potassium Sodium Niobate, and undoped Potassium Sodium Niobate (KNN). In some embodiments, the piezoelectric additive may be an inorganic additive comprising of doped Potassium Sodium Niobate (KNN) or undoped Potassium Sodium Niobate (KNN) in combination with at least one of PZT-Lead Zirconium Titanate, BT-Barium Titanate, and Zinc Oxide. In some embodiments, the piezoelectric additive may be Potassium Sodium Niobate (KNN), wherein the piezoelectric additive comprises between thirty (30) and ninety-eight (98) percent by weight of the polymer composite film. In some embodiments, the piezoelectric additive may be Potassium Sodium Niobate (KNN) in combination with Lithium, \wherein the piezoelectric additive comprises between thirty (30) and ninety-eight (98) percent by weight of the polymer composite film.

Figure 2:
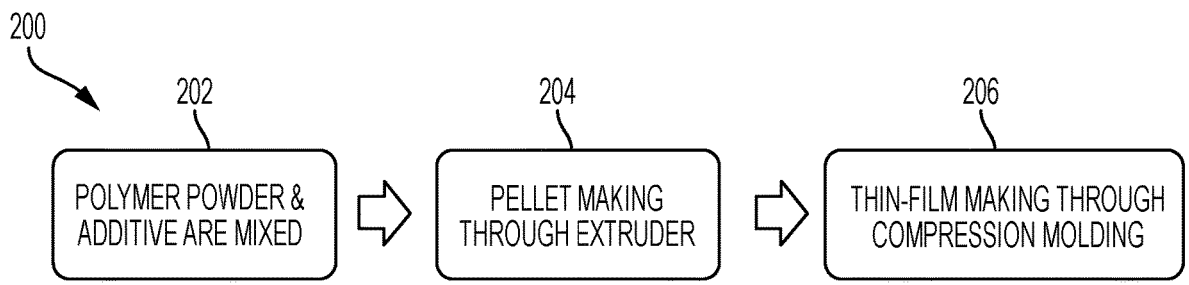
FIG. 2 is a flow chart illustrating a process for manufacturing piezoelectric composites according to embodiments of the disclosure.

FIG. 2 is a flow chart illustrating a process for manufacturing piezoelectric composites according to embodiments of the disclosure. A method 200 for manufacturing piezoelectric-based thin films may begin at block 202 with mixing a polymer powder base material with a piezoelectric additive. At block 204, pellets of material are made through an extrusion process. At block 206, the pellets used to form thin films through compression molding. Although the example of compression molding is illustrated, any other process of making thin films may be used, such as film extrusion and solution casting. The thin films formed in block 206 may be approximately 30-120 micrometers thick, or higher or lower.

Figures 3A, 3B:
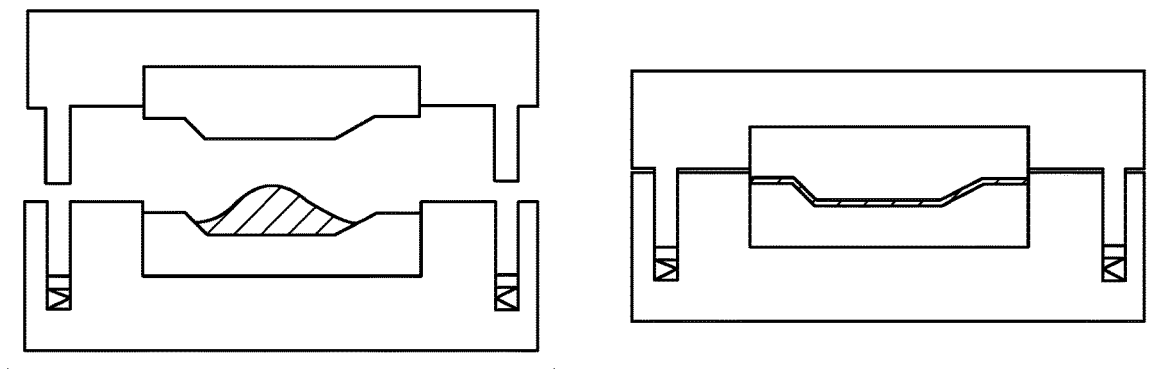
FIGS. 3A-D are illustrations of the manufacturing of piezoelectric composites according to embodiments of the disclosure.
Figure 3C:
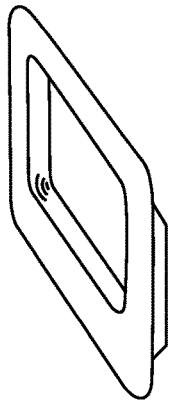
Figure 3D:
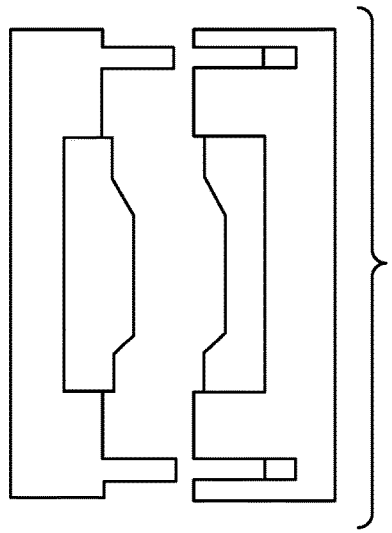

FIGS. 3A-D are illustrations of the manufacturing of piezoelectric composites according to embodiments of the disclosure. FIG. 3A shows the placement of pellets into a compression molder. FIG. 3B shows the pellets hot-pressed to form thin films using compression molding at, e.g., 190° C. or otherwise above 150° C. FIG. 3C shows the mold opening after compression into thin films. FIG. 4D shows the product of thin film formed by compression-molding. Testing on the thin film can be performed by taking the POM-based thin films and cutting into smaller sizes for measurements. Electrodes can be deposited on the surface of the film by gold sputtering or by silver paste painting.

Figure 4:
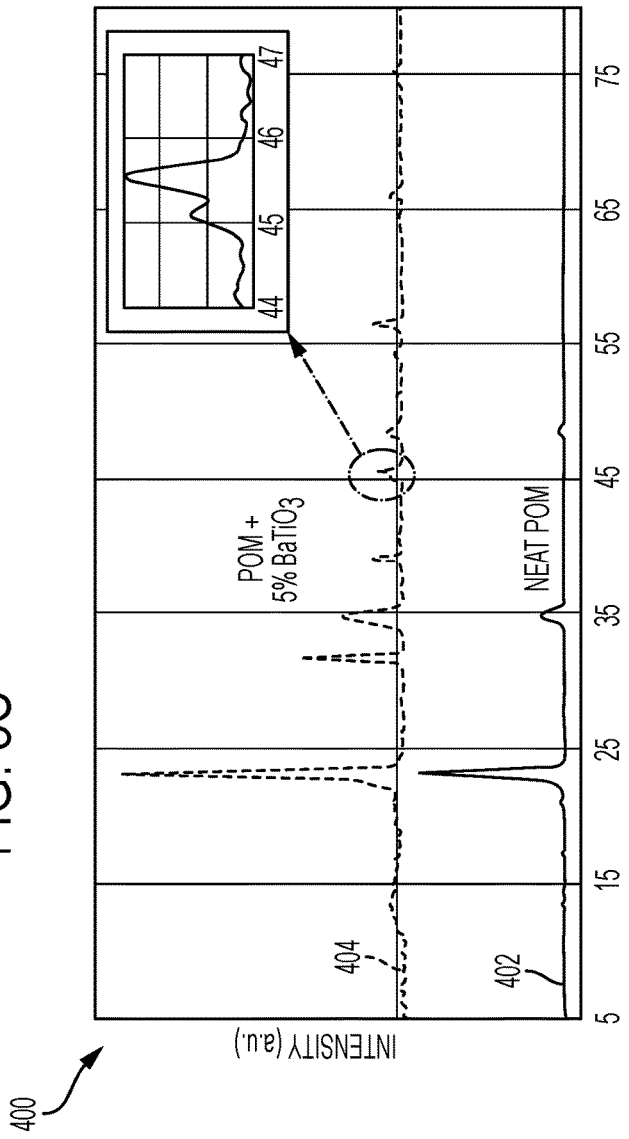
FIG. 4 is a graph illustrating an x-ray diffraction measurement of neat POM and a piezoelectric composite having POM and a piezoelectric additive according to some embodiments of the disclosure.

FIG. 4 is a graph 400 illustrating an x-ray diffraction measurement of a piezoelectric composite having POM and a piezoelectric additive according to some embodiments of the disclosure. A line 402 illustrates the XRD spectrum for POM without additive ("neat POM"). A line 404 illustrates the XRD spectrum for POM with 5% BaTiO3 piezoelectric additive. The XRD pattern of line 404 illustrates that the crystallinity of neat POM was maintained while preparing the composite. The XRD spectrum of BaTiO3 in the composite shows a tetragonal structure with lattice parameters a=b=3.986 Å and c=4.026 Å. The tetragonal structure of BaTiO3 is associated with the two peaks appearing around 45 degrees on inset graph 400A.

Evaluation of mechanical properties (modulus, hardness) of samples of POM-based composite thin films were conducted using the Nano-Indenter® XP (Keysight Technologies, Inc., Santa Rosa, Calif.). In this nano-indenter, the maximum distance allowed for the tip to travel, normal to the sample surface, is about 1.5 mm. The load and displacement data obtained in the nano-indentation tests were analyzed according to the model developed by Oliver and Pharr. Indentations were made with a constant strain rate of 0.05 s−1. On each sample, five indents were made and average values were calculated according to the Olivier and Pharr method.

Figure 5:
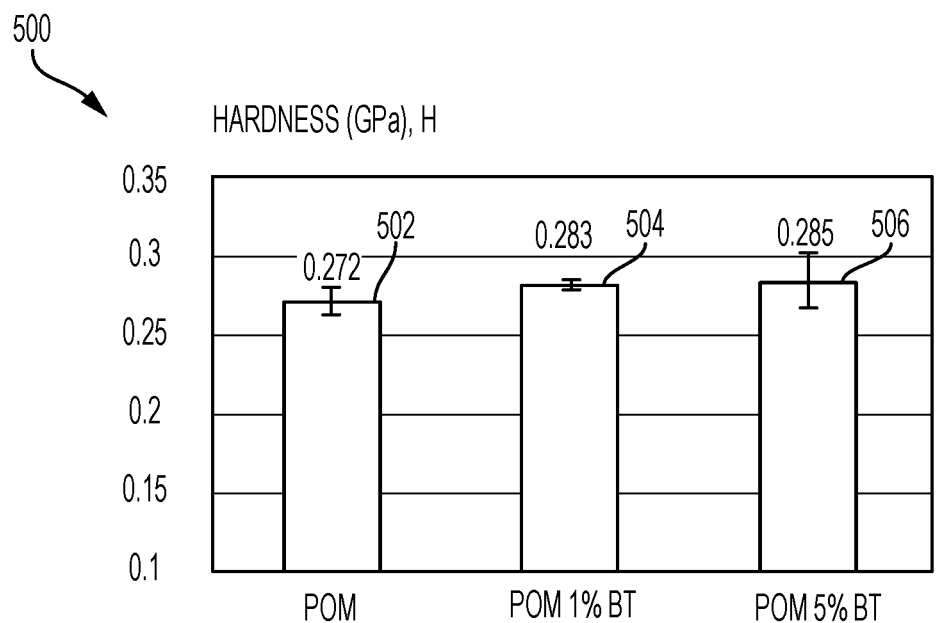
FIG. 5 is a graph illustrating hardness of a piezoelectric composite having POM and various percentages of piezoelectric additive according to some embodiments of the disclosure.
Figure 6:
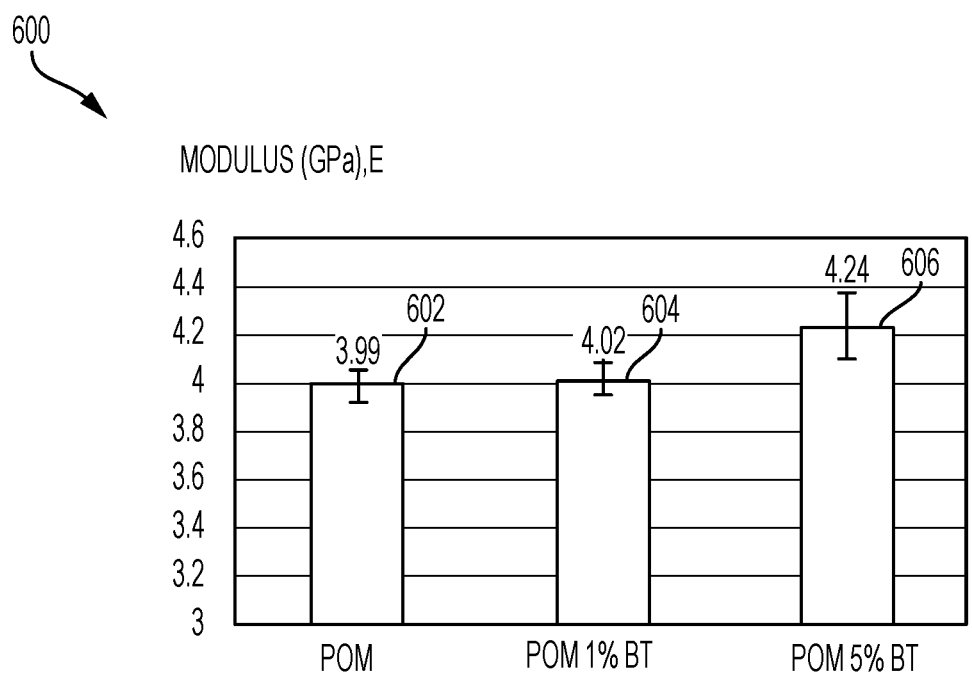
FIG. 6 is a graph illustrating modulus of a piezoelectric composite having POM and various percentages of piezoelectric additive according to some embodiments of the disclosure.

Mechanical properties of samples of neat POM, POM with 1% BaTiO3 additive, and 5% BaTiO3 additive are shown in FIG. 5 and FIG. 6. FIG. 5 is a graph illustrating hardness of a piezoelectric composite having POM and various percentages of piezoelectric additive according to some embodiments of the disclosure. In graph 500, bar 502 shows neat POM with a hardness value of 0.272 GPa, bar 504 shows POM with 1 w/w % of BaTiO3 with a hardness value of 0.283 GPa, and bar 506 shows POM with 5 w/w % of BaTiO3 with hardness value of 0.285 GPa. FIG. 6 is a graph illustrating hardness of a piezoelectric composite having POM and various percentages of piezoelectric additive according to some embodiments of the disclosure. In graph 600, bar 604 shows neat POM with a modulus value of 3.99 GPa, bar 606 shows POM with 1 w/w % of BaTiO3 with modulus value of 4.02 GPa, and bar 608 shows POM with 5 w/w % of BaTiO3 with modulus value of 4.24 GPa. Embodiments of the disclosed thin film with piezoelectric material greater than 5% w/w % may have a modulus value in excess of 4.1 GPa, such as 4.24 GPa as shown in the table above.

POM-based composite films have hardness and modulus values that are not significantly affected with the incorporation of piezo filler at loading levels of between, for example, 5-50 percent. Further, the modulus improve with the increasing loading percentage of Barium Titanate. Thus, the flexibility of the POM-based films produced with varying amounts of BaTiO3 are good and suitable to use in a device configuration.

Ferroelectric performance of piezoelectric materials can be evaluated through a measure d33 of a material. A piezometer can use a "quasi-static" or "Berlincourt" method to directly and accurately measure the d33 of the material. This d33 value represents charge per unit force in the direction of polarization. The d33 values for POM samples with various BaTiO3 w/w % values, along with capacitance and loss values, are shown in the table below:

| # | Polymer | BaTiO$_3$ (w/w %) | PZT (w/w %) | d33 (pC/N) | Capacitance (pF) | Tan delta |
|---|---------|-------------------|-------------|------------|------------------|-----------|
| 1 | POM     | —                 | —           | 0.1        | 57.8             | 0.0002    |
| 2 | POM     | 1                 | —           | 5          | 29.3             | 0.0048    |
| 3 | POM     | 5                 | —           | 19         | 37.5             |           |

Figure 9:
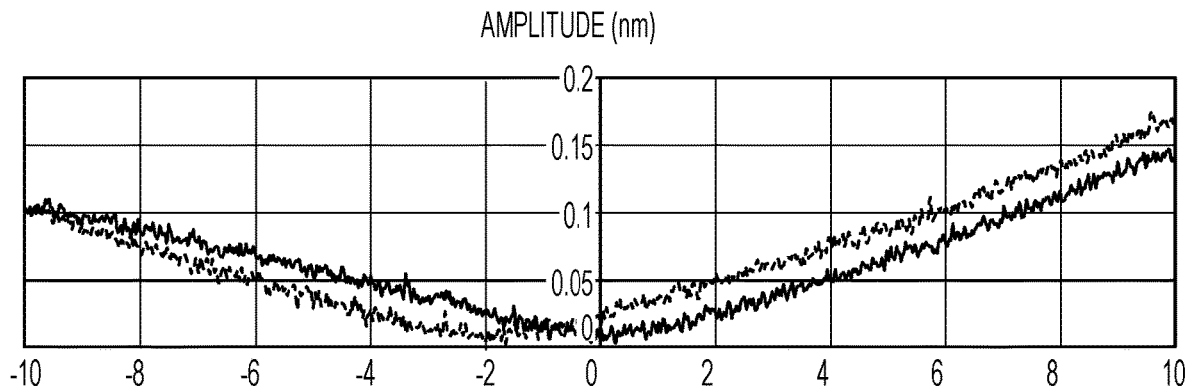
FIG. 9 is a graph illustrating a piezoelectric force microscopy (PFM) measurement on a polyoxymethylene (POM) material with piezoelectric additive of 5% BaTiO3 showing a d33 value of 11 pm/V according to embodiments of the disclosure.

The values are confirmed with piezoelectric force microscopy (PFM) measurements of the d33 values. Embodiments of the disclosed thin film with piezoelectric material greater than 5% w/w % may have a d33 value in excess of 5 pC/N, such as 19 pC/N as shown in the table above. Example PFM measurements are shown in FIG. 7, FIG. 8, and FIG. 9. FIG. 7 is a graph illustrating a piezoelectric force microscopy (PFM) measurement on a polyoxymethylene (POM) material showing a d33 value of 4 pm/V. FIG. 8 is a graph illustrating a piezoelectric force microscopy (PFM) measurement on a polyoxymethylene (POM) material with piezoelectric additive of 1% BaTiO3 showing a d33 value of 6 pm/V according to embodiments of the disclosure. FIG. 9 is a graph illustrating a piezoelectric force microscopy (PFM) measurement on a polyoxymethylene (POM) material with piezoelectric additive of 5% BaTiO$_3$ showing a d33 value of 11 pm/V according to embodiments of the disclosure. D33 values measured with PFM for POM materials with various BaTiO$_3$ w/w % values, along with that of baseline PVDF-TrFE copolymer, are shown in the table below:

| Sample | PVDF-TrFE | Neat POM | POM with 1% BaTiO$_3$ | POM with 5% BaTiO$_3$ | POM with 10% BaTiO$_3$ |
|---|---|---|---|---|---|
| d33 (pm/V) | 10 ± 2 | 3 ± 1 | 6 ± 2 | 11 ± 2 | 15 ± 2 |

Figure 10:
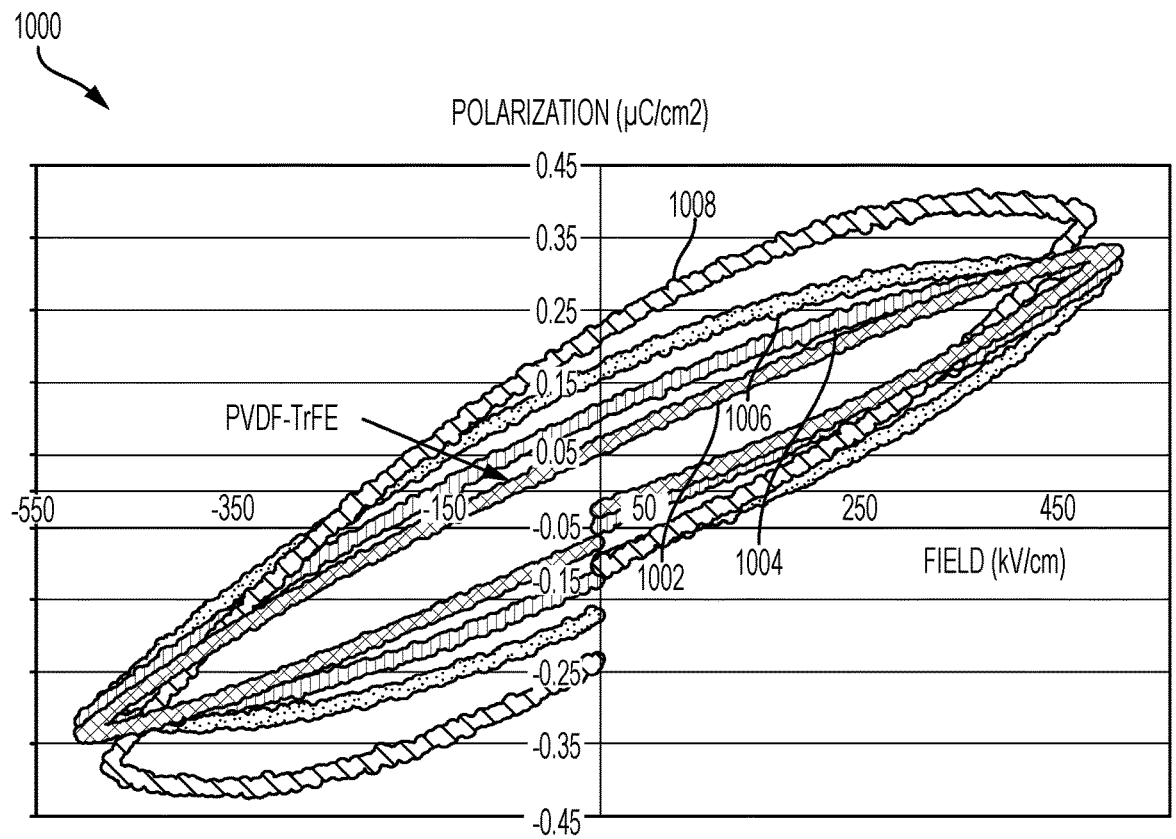
FIG. 10 is a graph illustrating a polarization-electric field (P-E) hysteresis curve illustrating remnant polarization in piezoelectric composites with a polyoxymethylene (POM) with different weight % of piezoelectric additive material, along with that of PVDF-TrFE baseline material, according to embodiments of the disclosure.
Figure 11:
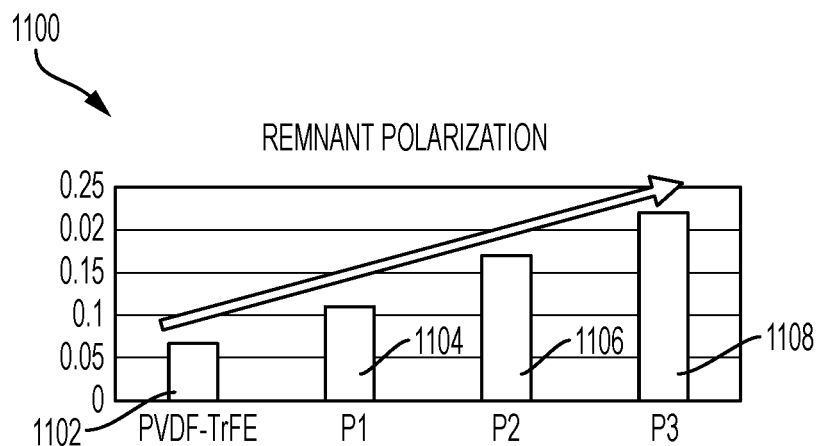
FIG. 11 is a graph illustrating remnant polarization in piezoelectric composites with a Polyoxymethylene (POM) material base and varying percentages of piezoelectric additive according to embodiments of the disclosure.

Ferroelectric properties of the POM-based materials in embodiments of the invention are also determined from ferroelectric hysteresis loop measurements on the samples. Ferroelectric hysteresis loops show the relationship between the induced polarization (P) and the applied electric field (E) for a material and are referred as the P-E loop. FIG. 10 is a graph illustrating a polarization-electric field (P-E) hysteresis curve illustrating remnant polarization in piezoelectric composites with a polyoxymethylene (POM) material according to embodiments of the disclosure. Graph 1000 includes lines showing ferroelectric hysteresis loops including line 1002 for baseline PVDF-TrFE, line 1004 for neat POM, line 1006 for POM with 1 w/w % of BaTiO3, and line 1007 for POM with 5 w/w % of BaTiO3. Graph 1000 illustrates that the P-E loops show enhancement of remnant polarization (e.g., point on Y-axis where electric field=0) for POM-based films over conventional PVDF-TrFE film without any poling. Improvement in remnant polarization for unpoled POM samples over conventional PVDF-TrFE is shown in the graph of FIG. 11. FIG. 11 is a graph illustrating remnant polarization in piezoelectric composites with a polyoxymethylene (POM) material and varying percentages of piezoelectric additive according to embodiments of the disclosure. Graph 1100 includes bars 1102 for PVDF-TrFE, 1104 for neat POM, 1106 for POM with 1 w/w % of BaTiO3, and 1108 for POM with 5 w/w % of BaTiO3.

Composite films with greater than 30 w/w % of piezoelectric additive also illustrate favorable d33 values. Measurements of POM-based samples with various weights of KLNN additive manufactured by different techniques are shown in the table below:

| # | POM | PZT | KLNN | Process | d33 (pC/N) |
|---|---|---|---|---|---|
| 1 | 20 w % | 80 w % | | Melt | 25 |
| 2 | 50% | | 50% | Melt | 6-10 |
| 3 | 20% | | 80% | Melt | 10-15 |
| 4 | 50% | | 50% | Solvent | 6-9 |

The use of piezoelectric additives in a polymer composite thin film with a POM base polymer as a matrix provides a material with inherent piezoelectric behavior for use in flexible components. In some embodiments, homogeneous dispersion of the inorganic additive in POM is achieved without the need of pre-treatment of inorganic additives. In some embodiments, piezoelectric performance is obtained without poling of the films. The materials in different embodiments of this disclosure provide low cost piezoelectric materials with improved processability by using small amounts of piezoelectric filler.

Figure 12:
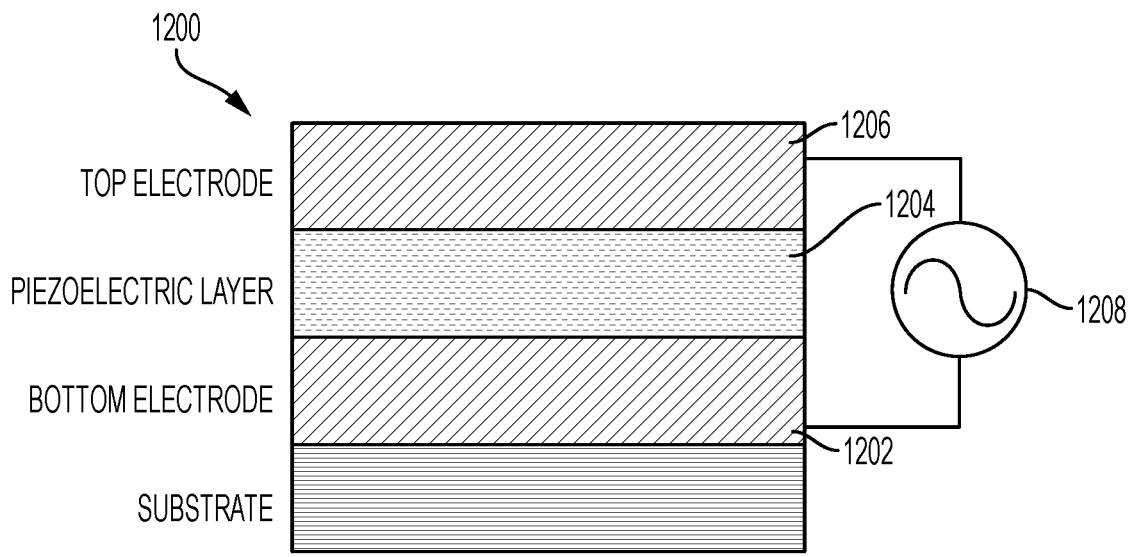
FIG. 12 is a cross-sectional view illustrating a piezoelectric actuator according to some embodiments of the disclosure.
Figure 13:
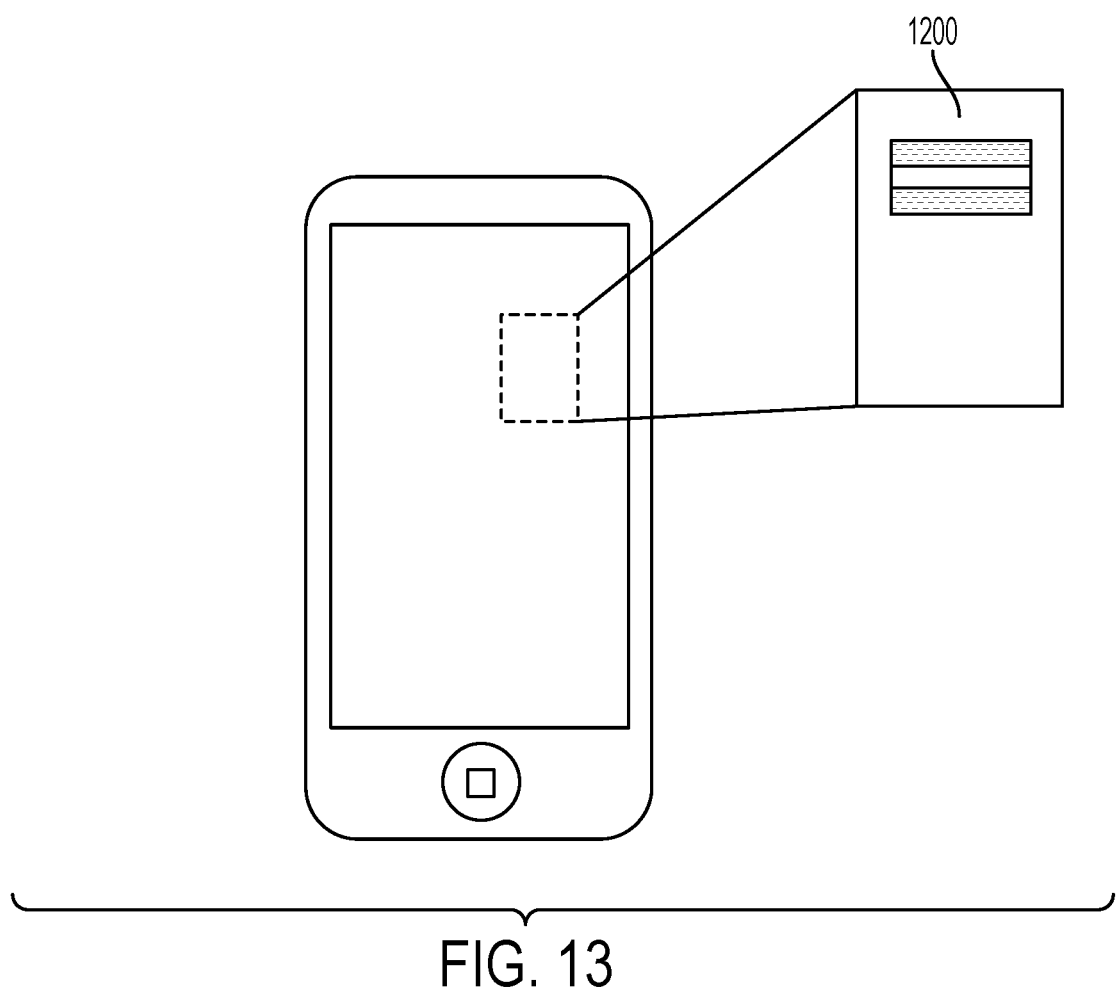
FIG. 13 is an illustration showing a mobile device with a piezoelectric sensor according to some embodiments of the disclosure.

An example device incorporating a piezoelectric composite thin film as described in embodiments of this disclosure is shown in FIG. 12. FIG. 12 is a cross-sectional view illustrating a piezoelectric actuator according to some embodiments of the disclosure. A device 1200 includes a bottom electrode 1202 and top electrode 1206 on opposite sides of a piezoelectric layer 1204. The piezoelectric layer 1204 may include one or more of the POM-based piezoelectric composite thin films described herein. A voltage source 1208 creates voltage differentials that cause the piezoelectric layer to change shape. The device 1200 may be used as an actuator to provide haptic feedback in an electronic device. The same device structure may be used as a piezoelectric sensor by replacing the voltage source 1208 with a measurement circuit. A force applied to the device 1200 will generate a voltage differential between the bottom electrode 1202 and the top electrode 1204 that can be measured by the measurement circuit and used to receive user input in an electronic device. Such a device may be integrated into, for example, a mobile device as part of an input device, as shown in FIG. 13. In some embodiments, the piezoelectric device may be incorporated into a display of a mobile device to provide haptic feedback on a touch screen.

Although the present disclosure and certain representative advantages have been described in detail, it should be understood that various changes, substitutions and alterations can be made herein without departing from the spirit and scope of the disclosure as defined by the appended claims. Moreover, the scope of the present application is not intended to be limited to the particular embodiments of the process, machine, manufacture, composition of matter, means, methods and steps described in the specification. As one of ordinary skill in the art will readily appreciate from the present disclosure, processes, machines, manufacture, compositions of matter, means, methods, or steps, presently existing or later to be developed that perform substantially the same function or achieve substantially the same result as the corresponding embodiments described herein may be utilized. Accordingly, the appended claims are intended to include within their scope such processes, machines, manufacture, compositions of matter, means, methods, or steps.

The invention claimed is:

1. An apparatus, comprising:
    a polymer composite thin film exhibiting piezoelectric properties, comprising:
        a polymer matrix, in which the polymer matrix comprises polyoxymethylene (POM); and
        a piezoelectric additive comprising greater than approximately five (5) percent by weight of the polymer composite thin film.

2. The apparatus of claim 1, in which the polymer composite thin film is a mechanically-flexible thin film.

3. The apparatus of claim 1, in which the piezoelectric additive comprises an inorganic additive comprising of at least one of PZT-Lead Zirconium Titanate, BT-Barium Titanate, Zinc Oxide, Lithium-doped Potassium Sodium Niobate Rubidium-doped Potassium Sodium Niobate, Caesium-doped Potassium Sodium Niobate, and undoped Potassium Sodium Niobate (KNN).

4. The apparatus of claim 1, in which the piezoelectric additive comprises an inorganic additive comprising at least one of doped Potassium Sodium Niobate (KNN) and undoped Potassium Sodium Niobate (KNN) in combination with at least one of PZT-Lead Zirconium Titanate, BT-Barium Titanate and Zinc Oxide.

5. The apparatus of claim 1, in which the piezoelectric additive comprises Potassium Sodium Niobate (KNN), and wherein the piezoelectric additive comprises between thirty (30) and ninety-eight (98) percent by weight of the polymer composite film.

6. The apparatus of claim 1, in which the piezoelectric additive comprises Potassium Sodium Niobate (KNN) in combination with Lithium, and wherein the piezoelectric additive comprises between thirty (30) and ninety-eight (98) percent by weight of the polymer composite film.

7. The apparatus of claim 1, in which the piezoelectric additive comprises at least one of a zero-dimensional, and one-dimensional structural pattern and a two-dimensional structural pattern.

8. The apparatus of claim 1, in which the polymer composite thin film comprises at least one of inorganic Perovskites, processing aids, dispersing aids and heat stabilizers, antioxidants, flow modifiers, and plasticizers.

9. The apparatus of claim 1, in which the polymer composite thin film is part of a piezoelectric device.

10. The apparatus of claim 9, in which the piezoelectric device comprises at least one of a sensor and an actuator.

11. The apparatus of claim 1, in which the polymer composite thin film has a thickness of between 30 and 120 micrometers.

12. The apparatus of claim 1, in which the polymer composite thin film has a d33 value exceeding 5 pC/N.

13. The apparatus of claim 1, in which the polymer composite thin film has a modulus value exceeding 4.1 GPa.

14. A method of manufacturing the polymer composite thin film of claim 1.

15. The method of claim 14, in which the method of manufacturing comprises physical mixing of polyoxymethylene (POM) powder with the piezoelectric additive in proportions w/w percentage of the piezoelectric additive to the polyoxymethylene (POM).

16. The method of claim 14, in which the method of manufacturing further comprises melt-blending in an extruder the polyoxymethylene (POM) powder with the piezoelectric additive to form pellets of a polymer composite.

17. The method of claim 14, in which the method of manufacturing further comprises compression molding or film extrusion.

18. The method of claim 17, in which the compression molding is performed by hot-pressing the pellets to form the polymer composite thin film at a temperature exceeding 150 degrees Celsius.

19. A piezoelectric sensor comprising the polymer composite thin film of claim 1, in which the piezoelectric sensor is configured to generate an analog signal proportional to an amount of deflection applied to the piezoelectric sensor by a user.

20. The piezoelectric sensor of claim 19, in which the piezoelectric sensor is integrated in a mobile device.

\* \* \* \* \*